US009444443B2

(12) United States Patent
Chung et al.

(10) Patent No.: US 9,444,443 B2
(45) Date of Patent: Sep. 13, 2016

(54) GATE DRIVER, METHOD OF DRIVING DISPLAY PANEL USING THE SAME AND DISPLAY APPARATUS HAVING THE SAME

(71) Applicant: Samsung Display Co., Ltd., Yongin, Gyeonggi-Do (KR)

(72) Inventors: Bo-Yong Chung, Yongin (KR); Jung-Mi Choi, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 249 days.

(21) Appl. No.: 13/959,998

(22) Filed: Aug. 6, 2013

(65) Prior Publication Data

US 2014/0125648 A1    May 8, 2014

(30) Foreign Application Priority Data

Nov. 5, 2012    (KR) .................. 10-2012-0123988

(51) Int. Cl.
  *G09G 5/00*      (2006.01)
  *H03K 17/0812*   (2006.01)
  *G09G 3/36*      (2006.01)
  *G11C 19/28*     (2006.01)

(52) U.S. Cl.
  CPC ...... *H03K 17/08122* (2013.01); *G09G 3/3677* (2013.01); *G11C 19/28* (2013.01); *G09G 2310/0286* (2013.01); *G09G 2370/08* (2013.01)

(58) Field of Classification Search
  CPC ............. G09G 3/3677; G09G 3/3266; G09G 2310/0286; G11C 19/28
  See application file for complete search history.

(56) References Cited

U.S. PATENT DOCUMENTS

| 8,044,908 B2 | 10/2011 | Lee | |
|---|---|---|---|
| 2004/0016925 A1* | 1/2004 | Watamura | 257/59 |
| 2007/0296681 A1* | 12/2007 | Kim et al. | 345/100 |
| 2008/0165110 A1 | 7/2008 | Kim et al. | |
| 2008/0303769 A1 | 12/2008 | Tobita | |
| 2009/0189679 A1* | 7/2009 | Lee et al. | 327/436 |
| 2010/0225621 A1 | 9/2010 | Jung et al. | |
| 2011/0148853 A1* | 6/2011 | Ko | G09G 3/3677 345/213 |
| 2012/0098826 A1* | 4/2012 | Lee et al. | 345/419 |
| 2012/0188290 A1* | 7/2012 | Park et al. | 345/690 |

FOREIGN PATENT DOCUMENTS

| KR | 10-0634828 B1 | 10/2006 |
|---|---|---|
| KR | 10-2008-0064531 A | 7/2008 |
| KR | 10-2010-0100213 A | 9/2010 |

* cited by examiner

*Primary Examiner* — Dorothy Harris
(74) *Attorney, Agent, or Firm* — Robert E. Bushnell, Esq.

(57) ABSTRACT

A gate driver includes a plurality of stages respectively outputting a plurality of gate output signals. An N-th stage of the gate driver (where N is a positive integer) includes a first input part, a second input part, a pull up part, a pull down part, a holding part and a stabilizing part. The first input part transmits a first clock signal to a second node in response to a signal at a first node. The second input part transmits an input signal to the first node in response to a second clock signal. The pull up part pulls up the gate output signal in response to a signal at the second node. The pull down part pulls down the gate output signal in response to the signal at the first node. The holding part maintains the signal at the second node in response to the first clock signal. The stabilizing part stabilizes the gate output signal in response to the signal at the second node and a third clock signal.

21 Claims, 10 Drawing Sheets

GATE DRIVER, METHOD OF DRIVING DISPLAY PANEL USING THE SAME AND DISPLAY APPARATUS HAVING THE SAME

CLAIM OF PRIORITY

This application makes reference to, incorporates into this specification the entire contents of, and claims all benefits accruing under 35 U.S.C. §119 from an application earlier filed in the Korean Intellectual Property Office on Nov. 5, 2012 and there duly assigned Serial No. 10-2012-0123988.

BACKGROUND OF THE INVENTION

1. Field of the Invention

The present invention relates generally to a display apparatus. More particularly, the invention relates to a gate driver, a method of driving a display panel using the gate driver, and a display apparatus including the gate driver.

2. Description of the Related Art

Generally, a display apparatus includes a display panel and a display panel driver. The display panel includes a plurality of gate lines, a plurality of data lines and a plurality of pixels. The display panel driver includes a controller, a gate driver and a data driver.

In a method of manufacturing the display panel or in a process of testing static electricity in the display panel, static electricity may be transmitted to the gate driver through the gate lines so that a switching element of the gate driver may be protected from damage.

SUMMARY OF THE INVENTION

Exemplary embodiments of the invention provide a gate driver capable of protecting a switching element.

Exemplary embodiments of the invention also provide a method of driving a display panel using the gate driver.

Exemplary embodiments of the invention still also provide a display apparatus including the gate driver.

According to some exemplary embodiments, a gate driver includes a plurality of stages respectively outputting a plurality of gate output signals. An N-th stage (where N is a positive integer) includes a first input part, a second input part, a pull up part, a pull down part, a holding part and a stabilizing part. The first input part transmits a first clock signal to a second node in response to a signal at a first node. The second input part transmits an input signal to the first node in response to a second clock signal. The pull up part pulls up the gate output signal in response to a signal at the second node. The pull down part pulls down the gate output signal in response to the signal at the first node. The holding part maintains the signal at the second node in response to the first clock signal. The stabilizing part stabilizes the gate output signal in response to the signal at the second node and a third clock signal.

In exemplary embodiments, the stabilizing part may include a first switching element and a second switching element connected in series to each other.

In exemplary embodiments, the first switching element may include a gate electrode connected to the second node, a source electrode to which a pull up voltage is applied, and a drain electrode connected to a source electrode of the second switching element. The second switching element may include a gate electrode to which the third clock signal is applied, the source electrode connected to the drain electrode of the first switching element, and a drain electrode connected to the first node.

In exemplary embodiments, the first input part may include a first input switching element. The first input switching element may include a gate electrode connected to the first node, a source electrode to which the first clock signal is applied, and a drain electrode connected to the second node.

In exemplary embodiments, the second input part may include a second input switching element. The second input switching element may include a gate electrode to which the second clock signal is applied, a source electrode to which the input signal is applied, and a drain electrode connected to the first node.

In exemplary embodiments, the pull up part may include a pull up switching element. The pull up switching element may include a gate electrode connected to the second node, a source electrode to which a pull up voltage is applied, and a drain electrode connected to an output terminal outputting the gate output signal.

In exemplary embodiments, the pull down part may include a pull down switching element. The pull down switching element may include a gate electrode connected to the first node, a source electrode connected to an output terminal outputting the gate output signal and a drain electrode to which the third clock signal is applied.

In exemplary embodiments, the holding part may include a holding switching element. The holding switching element may include a gate electrode and a source electrode to which the first clock is applied, and a drain electrode connected to the second node.

In exemplary embodiments, the N-th stage may further include a concurrent driving controller inactivating the pull down part in response to a concurrent driving signal.

In exemplary embodiments, the concurrent driving controller may include a concurrent driving switching element. The concurrent driving switching element may include a gate electrode to which the concurrent driving signal is applied, a source electrode to which a high DC voltage is applied, and a drain electrode connected to the first node.

In exemplary embodiments, a pull up voltage applied to the pull up part may be substantially the same as the concurrent driving signal.

In exemplary embodiments, the second clock signal may have a wave form substantially the same as a wave form of the first clock signal. The third clock signal may have a timing different from a timing of the first clock signal.

In exemplary embodiments, the first clock signal, the second clock signal and the third clock signal may have different timings. A rising edge of the second clock signal may be disposed between a rising edge of the first clock signal and a rising edge of the third clock signal.

According to some exemplary embodiments, a method of driving a display panel includes transmitting a first clock signal to a second node in response to a signal at the first node, transmitting an input signal to the first node in response to a second clock signal, pulling up a gate output signal in response to a signal at the second node, pulling down the gate output signal in response to the signal at the first node, maintaining the signal at the second node in response to the first clock signal, and stabilizing the gate output signal in response to the signal at the second node and a third clock signal.

In exemplary embodiments, the gate output signal may be stabilized using a first switching element and a second switching element connected in series to each other.

In exemplary embodiments, the first switching element may include a gate electrode connected to the second node, a source electrode to which a pull up voltage is applied and a drain electrode connected to a source electrode of the second switching element. The second switching element may include a gate electrode to which the third clock signal is applied, the source electrode connected to the drain electrode of the first switching element, and a drain electrode connected to the first node.

According to some exemplary embodiments, a display apparatus includes a display panel, a data driver and a gate driver. The display panel includes a plurality of gate lines, a plurality of data lines crossing the gate lines, and a plurality of pixels. The data driver respectively outputs a plurality of data signals to the data lines. The gate driver includes a plurality of stages respectively outputting a plurality of gate output signals to the gate lines. An N-th stage (where N is a positive integer) of the gate driver includes a first input part, a second input part, a pull up part, a pull down part, a holding part and a stabilizing part. The first input part transmits a first clock signal to a second node in response to a signal at a first node. The second input part transmits an input signal to the first node in response to a second clock signal. The pull up part pulls up the gate output signal in response to a signal at the second node. The pull down part pulls down the gate output signal in response to the signal at the first node. The holding part maintains the signal at the second node in response to the first clock signal. The stabilizing part stabilizes the gate output signal in response to the signal at the second node and a third clock signal.

In exemplary embodiments, the stabilizing part may include a first switching element and a second switching element connected in series to each other.

In exemplary embodiments, the first switching element may include a gate electrode connected to the second node, a source electrode to which a pull up voltage is applied, and a drain electrode connected to a source electrode of the second switching element. The second switching element may include a gate electrode to which the third clock signal is applied, the source electrode connected to the drain electrode of the first switching element, and a drain electrode connected to the first node.

In exemplary embodiments, the gate line may include a first gate line part disposed on a gate metal layer and a second gate line part disposed on a layer different from the gate metal layer. The second gate line part may overlap with the first gate line part.

In exemplary embodiments, the second gate line part may be disposed on a layer the same as the data line.

In exemplary embodiments, the gate line may include a plurality of the first gate line parts disposed along an extending direction of the gate line. The first gate line parts may not be directly connected to each other.

In exemplary embodiments, the first gate line part may extend along an extending direction of the gate line.

According to the gate driver, the method of driving the display panel, and the display apparatus including the gate driver, the number of switching elements directly connected to a gate output terminal is minimized so that the gate driver may be protected from damage due to static electricity.

In addition, the gate line includes a first gate line portion and a second gate line portion which overlap each other, and which are disposed in different layers so that static electricity transmitted to the gate driver may be decreased.

Effectiveness of the present invention is not limited to the above effectiveness. Unmentioned effectiveness of the present invention may be clearly understood by those skilled in the art.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
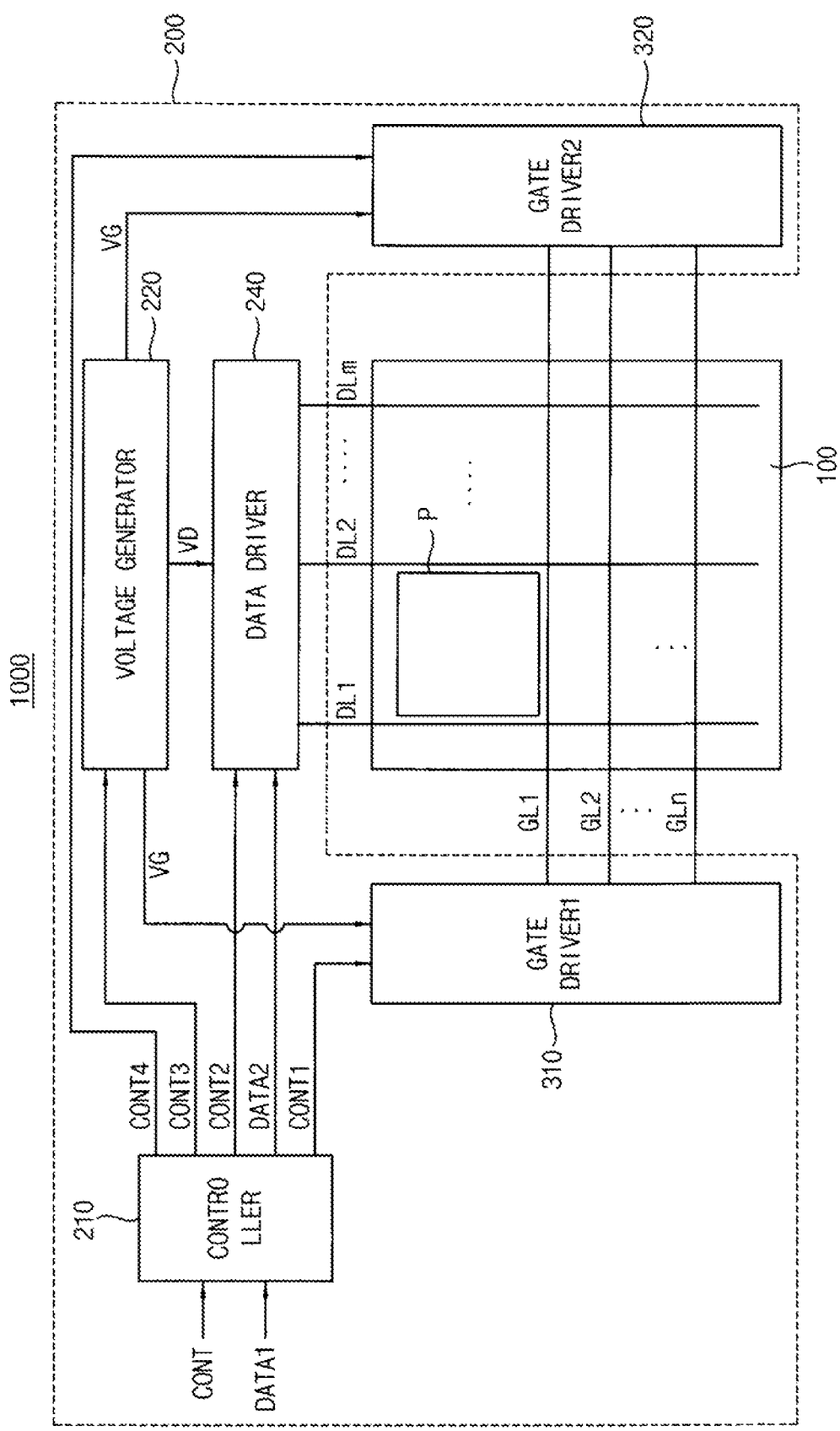
FIG. 1 is a block diagram illustrating a display apparatus according to an exemplary embodiment.

The exemplary embodiments are described more fully hereinafter with reference to the accompanying drawings. The invention may, however, be embodied in many different forms and should not be construed as limited to the exemplary embodiments set forth herein. In the drawings, the sizes and relative sizes of layers and regions may be exaggerated for clarity.

It will be understood that, when an element or layer is referred to as being "on," "connected to" or "coupled to" another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element or feature (or other elements or features) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized exemplary embodiments (and intermediate structures) of the invention. As such, variations from the shapes of the illustrations as a result, for example, of manufacturing techniques and/or tolerances are to be expected. Thus, exemplary embodiments should not be construed as limited to the particular shapes of regions illustrated herein, but are to include deviations in shapes that result, for example, from manufacturing. The regions illustrated in the figures are schematic in nature and their shapes are not intended to illustrate the actual shape of a region of a device, and are not intended to limit the scope of the invention.

Unless otherwise defined, all terms (including technical and scientific terms) used herein have the same meaning as commonly understood by one of ordinary skill in the art to which this invention pertains. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

FIG. 1 is a block diagram illustrating a display apparatus according to exemplary embodiment.

Referring to FIG. 1, the display apparatus 1000 includes a display panel 100 and a driver 200 for driving the display panel 100.

For example, the display apparatus 1000 may be an organic light emitting display apparatus. Alternatively, the display apparatus 1000 may be a liquid crystal display apparatus.

The display panel 100 displays an image. The display panel 100 includes a plurality of gate lines GL1 to GLn, a plurality of data lines DL1 to DLm, and a plurality of subpixels P connected to the gate lines GL1 to GLn and the data lines DL1 to DLm. For example, the subpixels P may be disposed in a matrix form.

In an exemplary embodiment, the number of the gate lines may be n, and the number of the data lines may be m, where n and m are positive integers. In an exemplary embodiment, the number of the subpixels P may be n×m. In an exemplary embodiment, a pixel may include three subpixels P so that the number of the pixels may be n×m×⅓.

The driver 200 includes a controller 210, a voltage generator 220, a first gate driver 310, a second gate driver 320 and a data driver 240.

The controller 210 receives an input control signal CONT and an input image signal DATA1 from an image source such as an external graphic apparatus. The input control signal CONT may include a main clock signal, a vertical synchronizing signal VSYNC, a horizontal synchronizing signal HSYNC, and a data enable signal. The controller 210 generates a data signal DATA2 which has a digital type and corresponds to operating conditions of the display panel 100 based on the input image signal DATA1. In addition, the controller 210 generates a first control signal CONT1 for controlling a driving timing of the first gate driver 310, a second control signal CONT2 for controlling a driving timing of the data driver 240, a third control signal CONT3 for controlling the voltage generator 220, and a fourth control signal CONT4 for controlling a driving timing of the second gate driver 320 based on the input control signal CONT. The controller 210 outputs the first to fourth control signals CONT1, CONT2, CONT3 and CONT4 to the first gate driver 310, the data driver 240, the voltage generator 220 and the second gate driver 320, respectively.

The voltage generator 220 receives an external voltage source. The voltage generator 220 generates a gate driving voltage VG for driving the first and second gate drivers 310 and 320, respectively, based on the external voltage source. The voltage generator 220 outputs the gate driving voltage VG to the first and second gate drivers 310 and 320, respectively. The voltage generator 220 generates a data driving voltage VD for driving the data driver 240 based on the external voltage source. The voltage generator 220 outputs the data driving voltage VD to the data driver 240.

For example, when the display apparatus 1000 is an organic light emitting display apparatus, the voltage generator 220 may generate a first source voltage and a second source voltage for driving an organic light emitting element, and may output the first and second source voltages to the display panel 100. When the display apparatus 1000 is a liquid crystal display apparatus, the voltage generator 220 may generate a common voltage and a storage voltage, and may output the common voltage and the storage voltage to the display panel 100.

The first gate driver 310 generates gate signals to drive the gate lines GL1 to GLn based on the first control signal CONT1 received from the controller 210 and the gate driving voltage VG received from the voltage generator 220. The first gate driver 310 sequentially outputs the gate signals to the gate lines GL1 to GLn in each frame.

The second gate driver 320 generates gate signals to drive the gate lines GL1 to GLn based on the fourth control signal CONT4 received from the controller 210 and the gate driving voltage VG received from the voltage generator 220. The second gate driver 320 sequentially outputs the gate signals to the gate lines GL1 to GLn in each frame.

In an exemplary embodiment, the first and second gate drivers 310 and 320, respectively, may be integrated on the display panel 100.

Although the display apparatus 1000 includes two gate drivers 310 and 320 to drive the gate lines GL1 to GLn in FIG. 1, the present invention is not limited thereto. Alternatively, the display apparatus 1000 may include a single gate driver to drive the gate lines GL1 to GLn.

The data driver 240 converts the data signal DATA2 received from the controller 210 into a data voltage of an analog type based on the second control signal CONT2 received from the controller 210 and the data driving voltage VD received from the voltage generator 220. The data driver 240 outputs the data voltage to the data lines DL1 to DLm.

Hereinafter, the operation of the display panel 100 is briefly explained.

When the gate signal is applied to one of the gate lines GL1 to GLn and the data voltages are applied to the data lines DL1 to DLm, the switching elements of the subpixels P connected to the gate line to which the gate signal is applied are turned on so that the data voltages are transmitted to the subpixels P connected to the gate line to which the gate signal is applied. According to levels of the data voltages, the subpixels P display an image.

Figure 2:
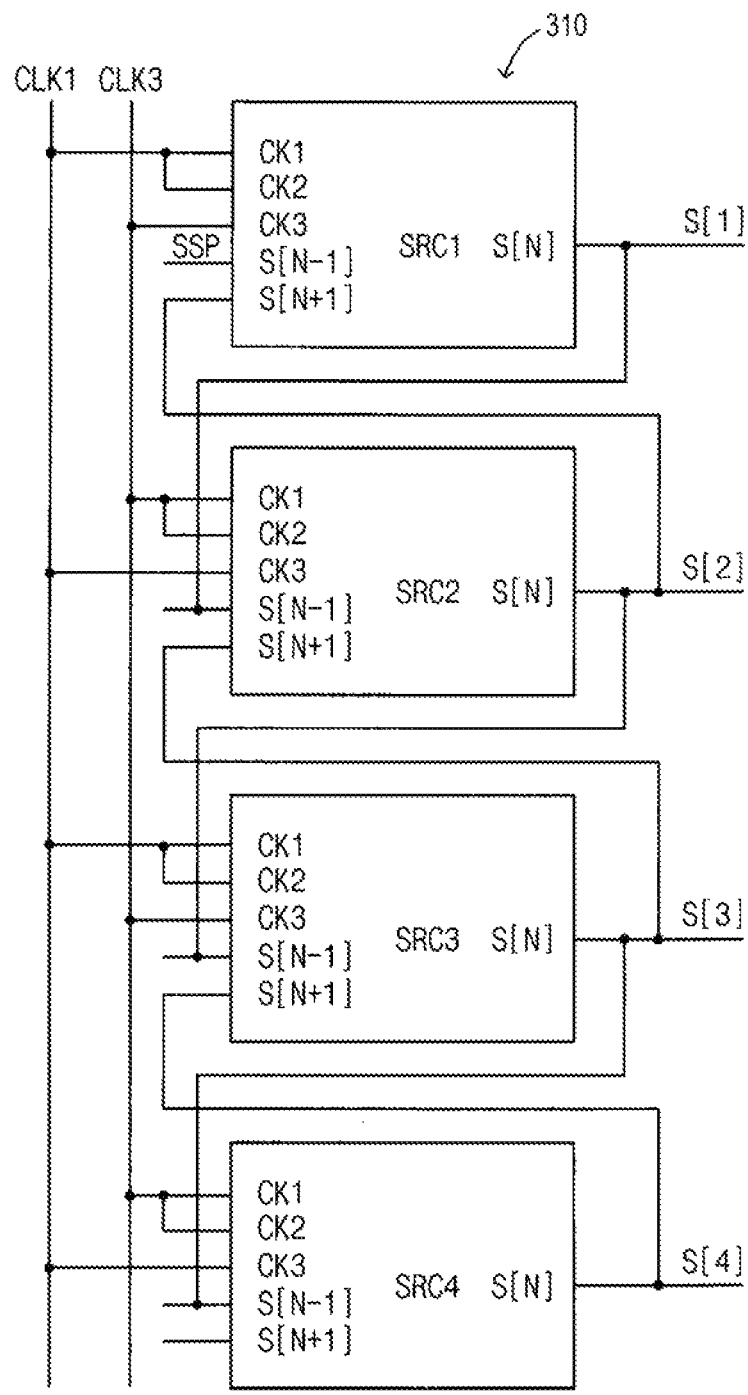
FIG. 2 is a block diagram illustrating a first gate driver of FIG. 1.
Figure 3:
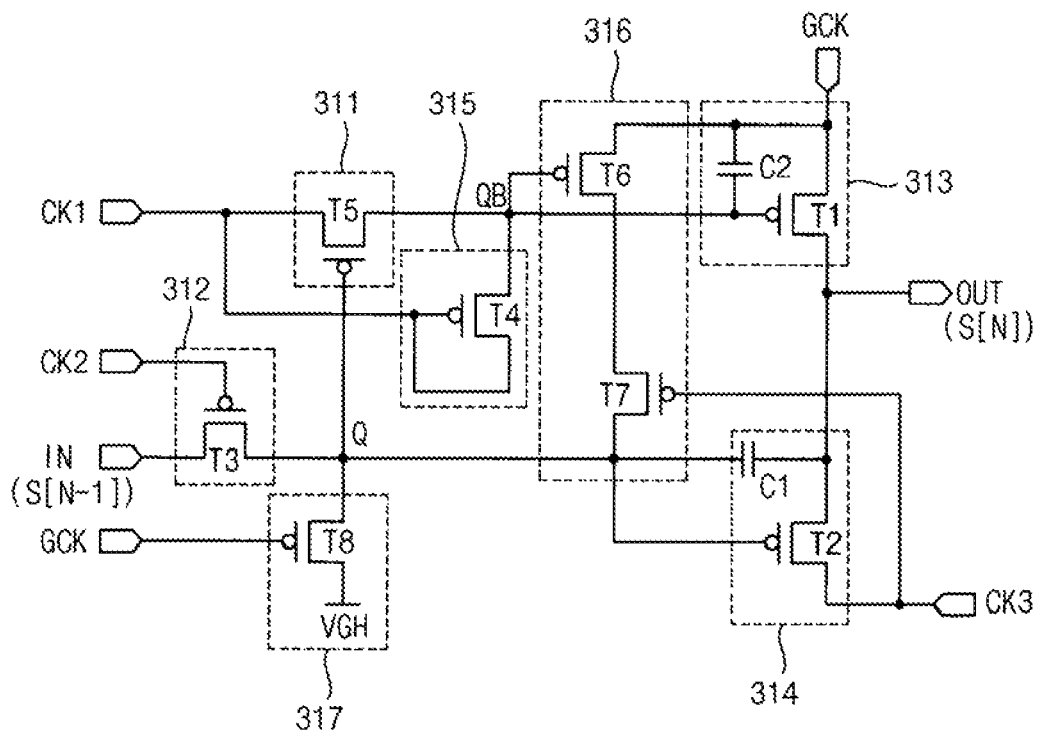
FIG. 3 is a circuit diagram illustrating an N-th stage of the first gate driver of FIG. 2.
Figure 4:
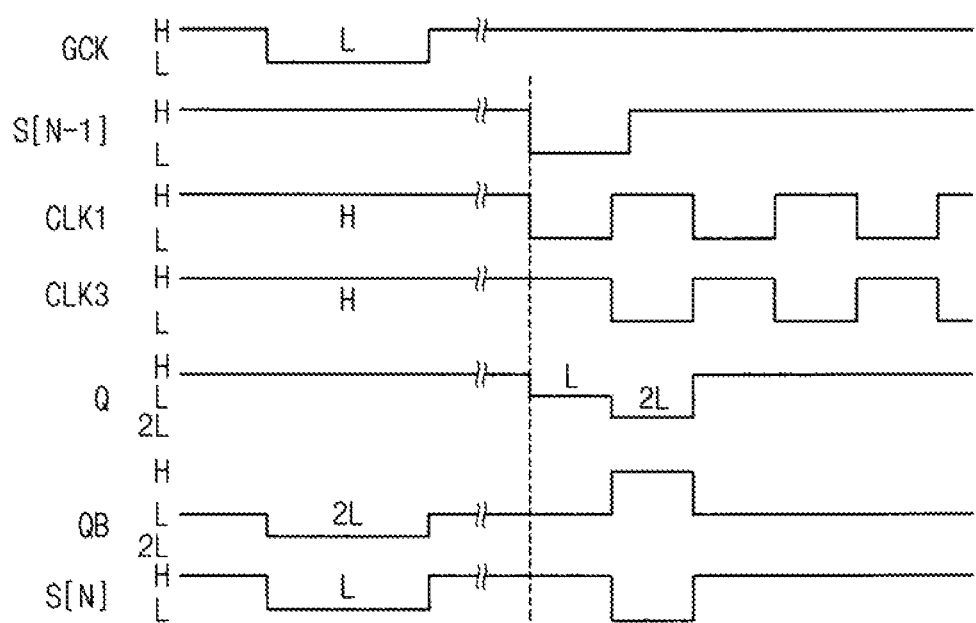
FIG. 4 is a timing diagram for explaining an operation of the first gate driver of FIG. 2.

FIG. 2 is a block diagram illustrating a first gate driver of FIG. 1. FIG. 3 is a circuit diagram illustrating an N-th stage of the first gate driver of FIG. 2. FIG. 4 is a timing diagram for explaining an operation of the first gate driver of FIG. 2.

Referring to FIGS. 1 to 4, the first gate driver 310 includes a plurality of stages SRC1, SRC2, SRC3, SRC4, . . . connected to one another.

Each of the stages SRC1, SRC2, SRC3, SRC4, . . . includes a first clock terminal CK1, a third clock terminal CK3, a first input terminal S[N−1], a second input terminal S[N+1] and an output terminal S[N]. Each of the stages SRC1, SRC2, SRC3, SRC4, . . . may further include a second clock terminal CK2, a concurrent driving signal input terminal GCK, and a high DC voltage input terminal VGH.

In the present exemplary embodiment, a first clock signal CLK1 and a third clock signal CLK3 having different timings are applied to the first clock terminal CK1 and the third clock terminal CK3, respectively. For example, the third clock signal CLK3 may be a signal inverted from the first clock signal CLK1.

In the present exemplary embodiment, the second clock terminal CK2 may be connected to the first clock terminal CK1. Thus, a second clock signal applied to the second clock terminal CK2 is the same as the first clock signal CLK1.

In adjacent stages, the first clock signal CLK1 and the third clock signal CLK3 are applied to the clock terminals in opposite sequences.

For example, the first clock signal CLK1 is applied to the first and second clock terminals CK1 and CK2, respectively, of odd-numbered stages SRC1, SRC3, . . . and the third clock signal CLK3 is applied to the third clock terminal CK3 of the odd-numbered stages SRC1, SRC3, . . . . In contrast, the first clock signal CLK1 is applied to the third clock terminal CK3 of even-numbered stages SRC2, SRC4, . . . and the third clock signal CLK3 is applied to the first and second clock terminals CK1 and CK2, respectively, of the even-numbered stages SRC1, SRC3, . . . .

One of a vertical start signal SSP and a gate signal of a previous stage is applied to the first input terminal S[N−1]. For example, the vertical start signal SSP is applied to the first input terminal S[N−1] of the first stage SRC1. The gate signals of the previous stages are respectively applied to the first input terminal S[N−1] of second to n-th stages SRC2 to SRCn.

One of a gate signal of a next stage and the vertical start signal SSP is applied to the second input terminal S[N+1]. For example, the gate signals of the next stages are respectively applied to the second input terminal S[N+1] of first to (n−1)-th stages SRC1 to SRCn−1. The vertical start signal SSP is applied to the second input terminal S[N+1] of the n-th stage SRCn.

The output terminal S[N] outputs the gate signal to the gate line electrically connected to the output terminal S[N]. For example, the gate signals S[1], S[3], . . . from the output terminal S[N] of the odd-numbered stages SRC1, SRC3, . . . are outputted in sync with a low signal of the third clock signal CLK3. For example, the gate signals S[2], S[4], . . . from the output terminal S[N] of the even-numbered stages SRC2, SRC4, . . . are outputted in sync with a low signal of the first clock signal CLK1.

Referring to FIG. 3, an N-th stage (where N is a positive integer) includes a first input part 311, a second input part 312, a pull up part 313, a pull down part 314, a holding part 315 and a stabilizing part 316. Herein N is a natural number.

The first input part 311 transmits the first clock signal CLK1 applied to the first clock terminal CK1 to a second node QB in response to a signal at a first node Q. The first input part 311 includes a first input switching element T5 including a gate electrode connected to the first node Q, a source electrode to which the first clock signal CLK1 is applied, and a drain electrode connected to the second node QB.

The second input part 312 transmits an input signal S[N−1] to the first node Q in response to the second clock signal CLK2 applied to the second clock terminal CK2. The second input part 312 includes a second input switching element T3 including a gate electrode to which the second clock signal CLK2 is applied, a source electrode to which the input signal S[N−1] is applied, and a drain electrode connected to the first node Q.

In the present exemplary embodiment, the second clock terminal CK2 is connected to the first clock terminal CK1 so that the second clock signal CLK2 may be the same as the first clock signal CLK1.

The pull up part 313 pulls up the gate output signal S[N] in response to a signal at the second node QB. The pull up part 313 includes a pull up switching element T1 including a gate electrode connected to the second node QB, a source electrode to which a pull up voltage is applied, and a drain electrode connected to an output terminal OUT which outputs the gate output signal S[N]. The pull up part 313 may further include a capacitor C2 including a first end connected to the source electrode of the pull up switching element T1 and a second end connected to the gate electrode of the pull up switching element T1.

In the present exemplary embodiment, the pull up voltage may be a concurrent driving signal GCK. The concurrent driving signal GCK has a low level when all stages of the gate driver 310 are outputting the gate output signal S[N] simultaneously. In contrast, the concurrent driving signal GCK has a high level when the stages of the gate driver 310 are sequentially driven.

The pull down part 314 pulls down the gate output signal S[N] in response to the signal at the first node Q. The pull down part 314 includes a pull down switching element T2 including a gate electrode connected to the first node Q, a source electrode connected to the output terminal OUT which outputs the gate output signal S[N], and a drain electrode connected to the third clock terminal CK3 to which the third clock signal CLK3 is applied. The pull down part 314 may further include a capacitor C1 including a first end connected to the source electrode of the pull down switching element T2 and a second end connected to the gate electrode of the pull down switching element T2.

The holding part 315 maintains the signal at the second node QB in response to the first clock signal CLK1. The holding part 315 includes a holding switching element T4 including a gate electrode to which the first clock signal CLK1 is applied, a source electrode connected to the gate electrode, and a drain electrode connected to the second node QB.

For example, when the first clock signal CLK1 has a high level, the holding switching element T4 is turned off. When the first clock signal CLK1 has a low level, the signal at the second node QB is maintained at a low level.

The stabilizing part 316 stabilizes the gate output signal S[N] in response to the signal at the second node QB and the third clock signal CLK3. The stabilizing part 316 includes a first switching element T6 and a second switching element T7 connected in series to each other. The first switching element T6 includes a gate electrode connected to the second node QB, a source electrode to which the pull up voltage is applied, and a drain electrode connected to a source electrode of the second switching element T7. The second switching element T7 includes a gate electrode connected to the third clock terminal CK3 to which the third clock signal CLK3 is applied, a source electrode connected to the drain electrode of the first switching element T6, and a drain electrode connected to the first node Q.

According to the present exemplary embodiment, the first and second switching elements T6 and T7, respectively, of the stabilizing part 316 are not directly connected to the gate output terminal OUT. Thus, the first and second switching elements T6 and T7, respectively, of the stabilizing part 316 may be protected from damage due to static electricity transmitted through the gate output terminal OUT along to the gate lines GL of the display panel 100 in a manufacturing process of the display panel 100 and in a static electricity test process.

The N-th stage may further include a concurrent driving controller 317 deactivating the pull down part 314 in response to the concurrent driving signal GCK. The concurrent driving controller 317 includes a concurrent driving switching element T8 including a gate electrode to which the concurrent driving signal GCK is applied, a source electrode to which a high DC voltage VGH is applied, and a drain electrode connected to the first node Q.

The first gate driver 310 is operated in a sequential driving mode and a concurrent driving mode. In the sequential driving mode, the concurrent driving signal GCK has a high level. When the concurrent driving signal GCK has the high level, the pull down part 314 pulls down the gate output signal S[N] in response to the signal at the first node Q.

In the concurrent driving mode, the concurrent driving signal GCK has a low level. When the concurrent driving signal GCK has the low level, the signal at the first node Q has a high level by virtue of the high DC voltage VGH so that the pull down part 314 is deactivated. In the concurrent driving mode, the gate output signal S[N] may be pulled up and down using the pull up part 313.

Hereinafter, the operation of the first gate driver 310 in the concurrent driving mode and the sequential driving mode will be explained with reference to FIG. 4.

In the concurrent driving mode, all stages of the gate driver 310 simultaneously outputs the gate output signal S[1], S[2], S[3], . . . .

In the concurrent driving mode, the concurrent driving signal GCK has the low level L, the signal at the first node Q has the high level H, and the signal at the second node QB has a second low level 2L. In response to the signal at the second node QB, the pull up part 313 generates the gate output signal S[N] having the low level L using the concurrent driving signal GCK. When the concurrent driving signal GCK changes to the high level H, the signal at the second node QB has the high level H, and the gate output signal S[N] changes to the high level H.

In the sequential driving mode, the stages of the gate driver 310 sequentially output the gate output signals S[1], S[2], S[3], . . . . In the sequential driving mode, the concurrent driving signal GCK has the high level H.

In the sequential driving mode, the input signal S[N−1] and the first clock signal CLK1 applied to the second clock terminal CK2 respectively have the low level L, and the signal at the first node Q has the low level L by the second input part 312. The signal at the second node QB has the low level L by the first input part 311 and the holding part 315.

When the third clock signal CLK3 changes to the low level L, the first node Q is bootstrapped by the capacitor C1 of the pull down part 314 so that the signal at the first node Q has the second low level 2L and the gate output signal S[N] having the low level L is outputted to the gate output terminal OUT.

When the first clock signal CLK1 turns back to the low level L, the input signal S[N−1] has the high level H. Thus, the signal at the first node Q changes to the high level H by the second input part 312. The signal at the second node QB has the low level L by the holding part 315. Thus, the pull up part 313 turns on in response to the signal at the second node QB so that the gate output signal S[N] has the high level H.

Then, the signal at the first node Q maintains the high level H and the signal at the second node QB maintains the low level L so that the gate output signal S[N] maintains the high level H.

According to the present exemplary embodiment, the first and second switching elements T6 and T7, respectively, of the stabilizing part 316 of the gate driver 310 are not directly connected to the gate output terminal OUT so that the gate driver 310 may be protected from damage due to static electricity.

Figure 5:
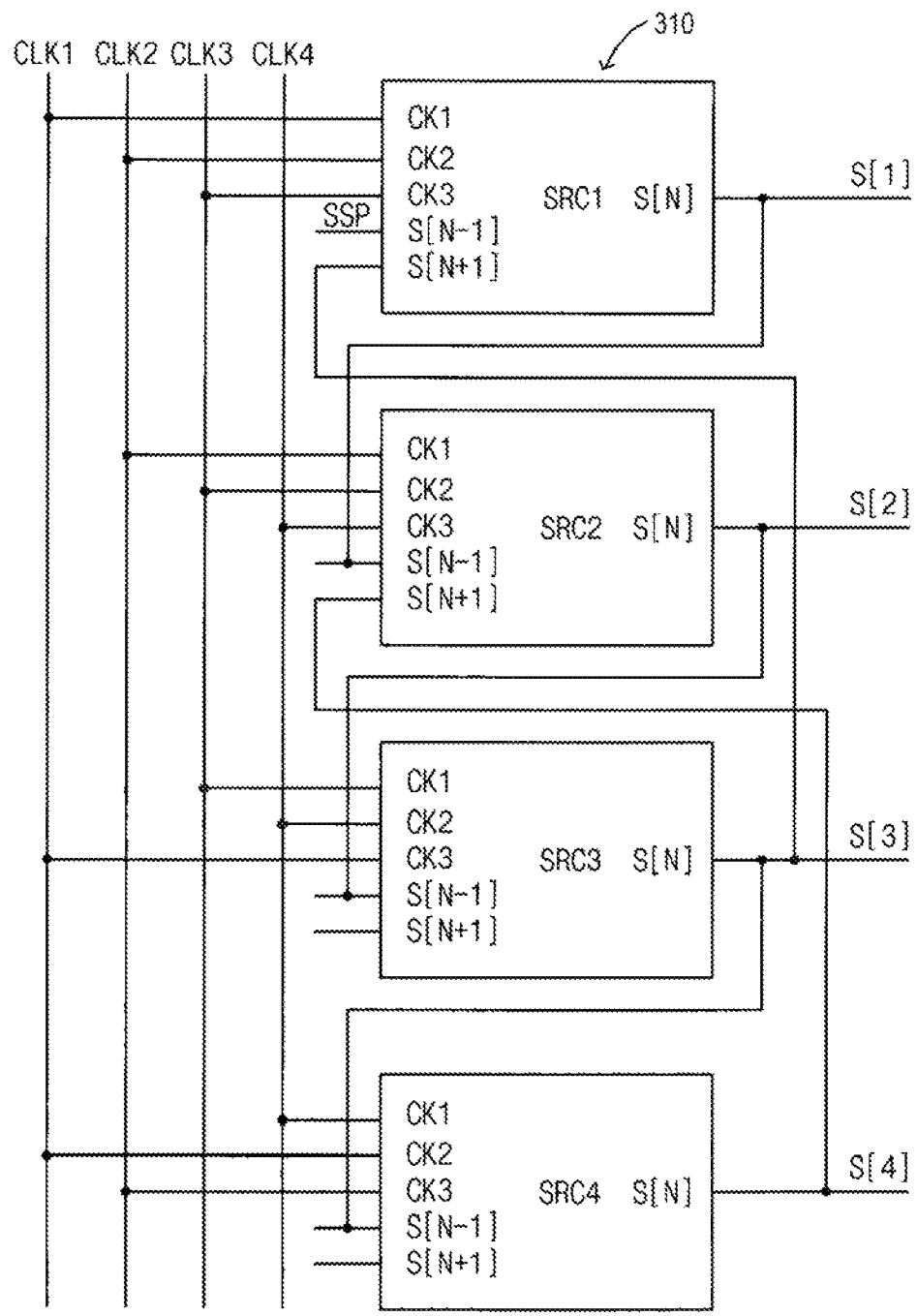
FIG. 5 is a block diagram illustrating a first gate driver according to an exemplary embodiment.
Figure 6:
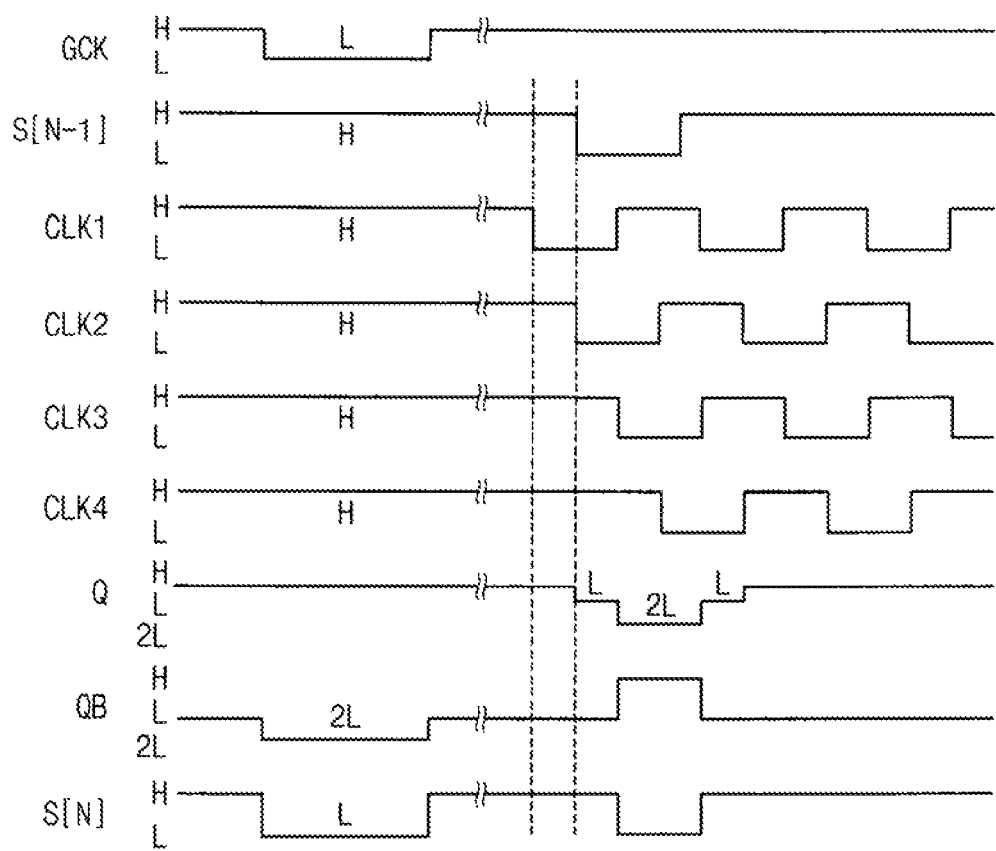
FIG. 6 is a timing diagram for explaining an operation of the first gate driver of FIG. 5.

FIG. 5 is a block diagram illustrating a first gate driver according to an exemplary embodiment. FIG. 6 is a timing diagram for explaining an operation of the first gate driver of FIG. 5.

The gate driver, the method of driving the display panel and the display apparatus of the present exemplary embodiment are substantially the same as the gate driver, the method of driving the display panel and the display apparatus explained with reference to FIGS. 1 to 4 except that the gate driver uses four clock signals and first and second clock signals are overlapped with each other. Thus, the same reference numerals will be used to refer to the same or like parts as those described in the exemplary embodiments of FIGS. 1 to 4, and any repetitive explanation concerning the above elements will be omitted.

Referring to FIGS. 1, 3, 5 and 6, the display apparatus 1000 includes a display panel 100 and a driver 200 for driving the display panel 100.

The display panel 100 displays an image. The display panel 100 includes a plurality of gate lines GL1 to GLn, a plurality of data lines DL1 to DLm, and a plurality of subpixels P connected to gate lines GL1 to GLn and the data lines DL1 to DLm.

The driver 200 includes a controller 210, a voltage generator 220, a first gate driver 310, a second gate driver 320 and a data driver 240.

The first gate driver 310 includes a plurality of stages SRC1, SRC2, SRC3, SRC4, . . . connected to one another.

Each of the stages SRC1, SRC2, SRC3, SRC4, . . . includes a first clock terminal CK1, a second clock terminal CK2, a third clock terminal CK3, a first input terminal S[N−1], a second input terminal S[N+1] and an output terminal S[N]. Each of the stages SRC1, SRC2, SRC3, SRC4, . . . may further include a concurrent driving signal input terminal GCK, and a high DC voltage input terminal VGH.

In the present exemplary embodiment, four clock signals CLK1 to CLK4 are applied to the stages of the gate driver 310. Three clock signals among the four clock signals CLK1 to CLK4 are applied to one stage of the gate driver 310.

The first clock signal CLK1, the second clock signal CLK2, the third clock signal CLK3 and the fourth clock signal CLK4 have different timings. For example, the third clock signal CLK3 may be a signal inverted from the first clock signal CLK1. For example, the fourth clock signal CLK4 may be a signal inverted from the second clock signal CLK2.

A period of a low signal of the first clock signal CLK1 and a period of a low signal of the second clock signal CLK2 may overlap with each other. The period of the low signal of the second clock signal CLK2 and a period of a low signal of the third clock signal CLK3 may overlap with each other. The period of the low signal of the third clock signal CLK3 and a period of a low signal of the fourth clock signal CLK4 may overlap with each other. The period of the low signal of the fourth clock signal CLK4 and the period of the low signal of the first clock signal CLK1 may overlap with each other.

A rising edge of the second clock signal CLK2 may be disposed between a rising edge of the first clock signal CLK1 and a rising edge of the third clock signal CLK3.

For example, the first, second and third clock signals CLK1 to CLK3 having different timings are respectively provided to the first, second and third clock terminals CK1 to CK3.

Different combinations of the clock signals may be applied to adjacent four stages.

For example, to the first stage SRC1, SRC5, . . . , the first clock signal CLK1 is provided to the first clock terminal CK1, the second clock signal CLK2 is provided to the second clock terminal CK2, and the third clock signal CLK3 is provided to the third clock terminal CK3.

For example, to the second stage SRC2, SRC6, . . . , the second clock signal CLK2 is provided to the first clock terminal CK1, the third clock signal CLK3 is provided to the second clock terminal CK2, and the fourth clock signal CLK4 is provided to the third clock terminal CK3.

For example, to the third stage SRC3, SRC7, . . . , the third clock signal CLK3 is provided to the first clock terminal CK1, the fourth clock signal CLK4 is provided to the second clock terminal CK2, and the first clock signal CLK1 is provided to the third clock terminal CK3.

For example, to the fourth stage SRC4, SRC8, . . . , the fourth clock signal CLK3 is provided to the first clock terminal CK1, the first clock signal CLK1 is provided to the second clock terminal CK2, and the second clock signal CLK2 is provided to the third clock terminal CK3.

One of a vertical start signal SSP and a gate signal of a previous stage is applied to the first input terminal S[N−1]. One of a gate signal of a next stage and the vertical start signal SSP is applied to the second input terminal S[N+1]. The output terminal S[N] outputs the gate signal to the gate line electrically connected to the output terminal S[N].

As shown in FIG. 3, an N-th stage includes a first input part 311, a second input part 312, a pull up part 313, a pull down part 314, a holding part 315 and a stabilizing part 316.

The first input part 311 transmits the first clock signal CLK1 applied to the first clock terminal CK1 to a second node QB in response to a signal at a first node Q.

The second input part 312 transmits an input signal S[N−1] to the first node Q in response to the second clock signal CLK2 applied to the second clock terminal CK2.

The pull up part 313 pulls up the gate output signal S[N] in response to a signal at the second node QB.

The pull down part 314 pulls down the gate output signal S[N] in response to the signal at the first node Q.

The holding part 315 maintains the signal at the second node QB in response to the first clock signal CLK1.

The stabilizing part 316 stabilizes the gate output signal S[N] in response to the signal at the second node QB and the third clock signal CLK3. The stabilizing part 316 includes a first switching element T6 and a second switching element T7 connected in series to each other. The first switching element T6 includes a gate electrode connected to the second node QB, a source electrode to which the pull up voltage is applied, and a drain electrode connected to a source electrode of the second switching element T7. The second switching element T7 includes a gate electrode connected to the third clock terminal CK3 to which the third clock signal CLK3 is applied, the source electrode connected to the drain electrode of the first switching element T6 and a drain electrode connected to the first node Q.

According to the present exemplary embodiment, the first and second switching elements T6 and T7, respectively, of the stabilizing part 316 are not directly connected to the gate output terminal OUT. Thus, the first and second switching elements T6 and T7, respectively, of the stabilizing part 316 may be protected from damage due to static electricity transmitted through the gate output terminal OUT along to the gate lines GL of the display panel 100 in a manufacturing process of the display panel 100 and in a static electricity test process.

The N-th stage may further include a concurrent driving controller 317 deactivating the pull down part 314 in response to the concurrent driving signal GCK. The concurrent driving controller 317 includes a concurrent driving switching element T8, including a gate electrode to which the concurrent driving signal GCK is applied, a source electrode to which a high DC voltage VGH is applied, and a drain electrode connected to the first node Q.

The gate driver 310 is operated in a sequential driving mode and in a concurrent driving mode. In the sequential driving mode, the concurrent driving signal GCK has a high level. When the concurrent driving signal GCK has the high level, the pull down part 314 pulls down the gate output signal S[N] in response to the signal at the first node Q.

In the concurrent driving mode, the concurrent driving signal GCK has a low level L. When the concurrent driving signal GCK has the low level L, the signal at the first node Q has a high level H by the high DC voltage VGH so that the pull down part 314 is deactivated. In the concurrent driving mode, the gate output signal S[N] may be pulled up and down using the pull up part 313.

In the sequential driving mode, when the input signal S[N−1] and the second clock signal CLK2 respectively have the low level L, the signal at the first node Q has the low level L and the signal at the second node QB has the low level L.

When the third clock signal CLK3 changes to the low level L, the signal at the first node Q decreases to a second low level 2L, and the gate output signal S[N] having the low level L is outputted to the gate output terminal OUT.

When the first clock signal CLK1 turns back to the low level L, the gate output signal S[N] has the high level H, and the gate output signal S[N] maintains the high level H.

According to the present exemplary embodiment, the first and second switching elements T6 and T7 of the stabilizing part 316 of the gate driver 310 are not directly connected to the gate output terminal OUT so that the gate driver 310 may be protected from damage due to static electricity.

Figure 7:
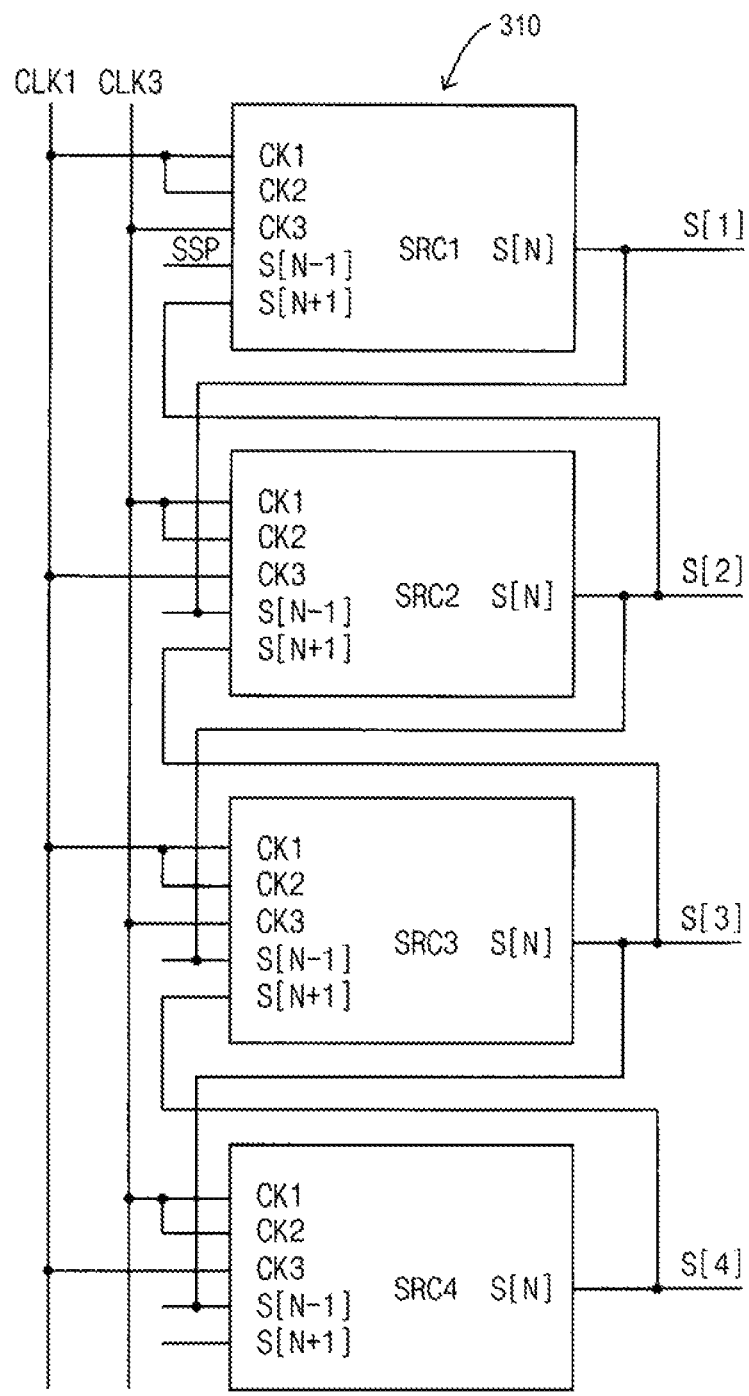
FIG. 7 is a block diagram illustrating a first gate driver according to an exemplary embodiment.
Figure 8:
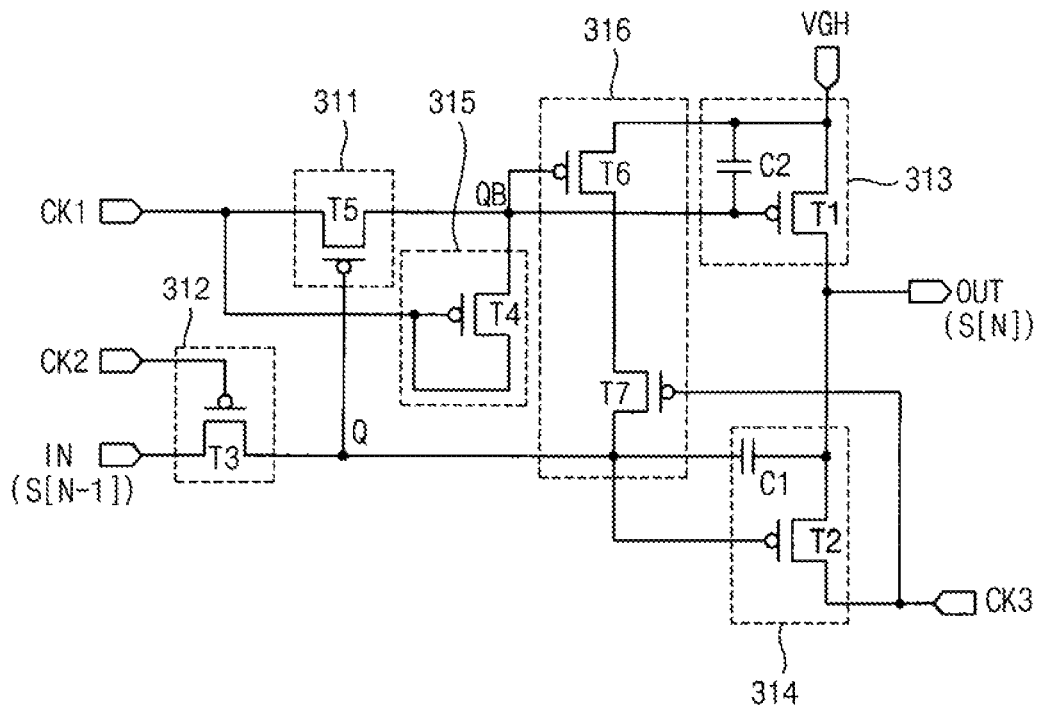
FIG. 8 is a circuit diagram illustrating an N-th stage of the first gate driver of FIG. 7.
Figure 9:
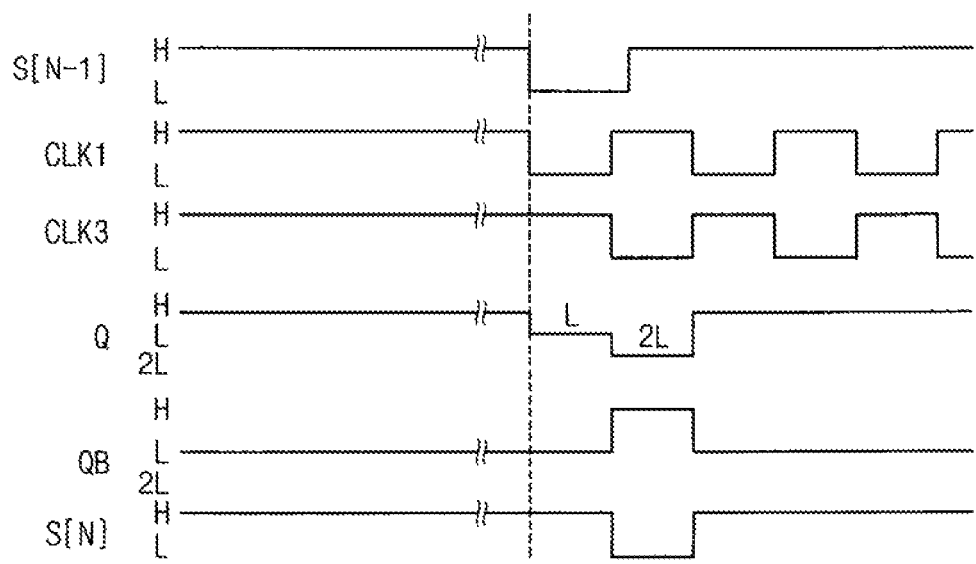
FIG. 9 is a timing diagram for explaining an operation of the first gate driver of FIG. 7.

FIG. 7 is a block diagram illustrating a first gate driver according to an exemplary embodiments. FIG. 8 is a circuit diagram illustrating an N-th stage of the first gate driver of FIG. 7. FIG. 9 is a timing diagram for explaining an operation of the first gate driver of FIG. 7.

The gate driver, the method of driving the display panel and the display apparatus of the present exemplary embodiment are substantially the same as the gate driver, the method of driving the display panel and the display apparatus explained with reference to FIGS. 1 to 4 except that the gate driver is operated only in the sequential driving mode. Thus, the same reference numerals will be used to refer to the same or like parts as those described in the exemplary embodiments of FIGS. 1 to 4, and any repetitive explanation concerning the above elements will be omitted.

Referring to FIGS. 1, 3 and 7 to 9, the display apparatus 1000 includes a display panel 100 and a driver 200 for driving the display panel 100.

The display panel 100 displays an image. The display panel 100 includes a plurality of gate lines GL1 to GLn, a plurality of data lines DL1 to DLm and a plurality of subpixels P connected to gate lines GL1 to GLn and to the data lines DL1 to DLm.

The driver 200 includes a controller 210, a voltage generator 220, a first gate driver 310, a second gate driver 320 and a data driver 240.

The first gate driver 310 includes a plurality of stages SRC1, SRC2, SRC3, SRC4, . . . connected to one another.

Each of the stages SRC1, SRC2, SRC3, SRC4, . . . includes a first clock terminal CK1, a third clock terminal CK3, a first input terminal S[N−1], a second input terminal S[N+1] and an output terminal S[N]. Each of the stages SRC1, SRC2, SRC3, SRC4, . . . may further include a second clock terminal CK2 and a concurrent driving signal input terminal GCK.

In the present exemplary embodiment, a first clock signal CLK1 and a third clock signal CLK3 having different timings are applied to the first clock terminal CK1 and the third clock terminal CK3. For example, the third clock signal CLK3 may be a signal inverted from the first clock signal CLK1.

In the present exemplary embodiment, the second clock terminal CK2 may be connected to the first clock terminal CK1. Thus, a second clock signal applied to the second clock terminal CK2 is the same as the first clock signal CLK1.

An N-th stage includes a first input part 311, a second input part 312, a pull up part 313, a pull down part 314, a holding part 315 and a stabilizing part 316.

The first input part 311 transmits the first clock signal CLK1 applied to the first clock terminal CK1 to a second node QB in response to a signal at a first node Q.

The second input part 312 transmits an input signal S[N−1] to the first node Q in response to the second clock signal CLK2 applied to the second clock terminal CK2.

The pull up part 313 pulls up the gate output signal S[N] in response to a signal at the second node QB.

The pull down part 314 pulls down the gate output signal S[N] in response to the signal at the first node Q.

The holding part 315 maintains the signal at the second node QB in response to the first clock signal CLK1.

The stabilizing part 316 stabilizes the gate output signal S[N] in response to the signal at the second node QB and the third clock signal CLK3. The stabilizing part 316 includes a first switching element T6 and a second switching element T7 connected in series to each other. The first switching element T6 includes a gate electrode connected to the second node QB, a source electrode to which a pull up voltage VGH is applied, and a drain electrode connected to a source electrode of the second switching element T7. The second switching element T7 includes a gate electrode connected to the third clock terminal CK3 to which the third clock signal CLK3 is applied, the source electrode connected to the drain electrode of the first switching element T6, and a drain electrode connected to the first node Q.

According to the present exemplary embodiment, the first and second switching elements T6 and T7, respectively, of the stabilizing part 316 are not directly connected to the gate output terminal OUT. Thus, the first and second switching elements T6 and T7, respectively, of the stabilizing part 316 may be protected from damage due to static electricity transmitted through the gate output terminal OUT along to the gate lines GL of the display panel 100 in a manufacturing process of the display panel 100 and in a static electricity test process.

When the input signal S[N−1] and the second clock signal CLK2, which is the same as the first clock signal CLK1, respectively have the low level L, the signal at the first node Q has the low level L by the second input part 312 and the signal at the second node QB has the low level L.

When the third clock signal CLK3 changes to the low level L, the signal at the first node Q decreases to a second low level 2L, and the gate output signal S[N] having the low level L is outputted to the gate output terminal OUT.

When the first clock signal CLK1 turns back to the low level L, the gate output signal S[N] has the high level H, and the gate output signal S[N] maintains the high level H.

According to the present exemplary embodiment, the first and second switching elements T6 and T7, respectively, of the stabilizing part 316 of the gate driver 310 are not directly connected to the gate output terminal OUT so that the gate driver 310 may be protected from damage due to static electricity.

Figure 10:
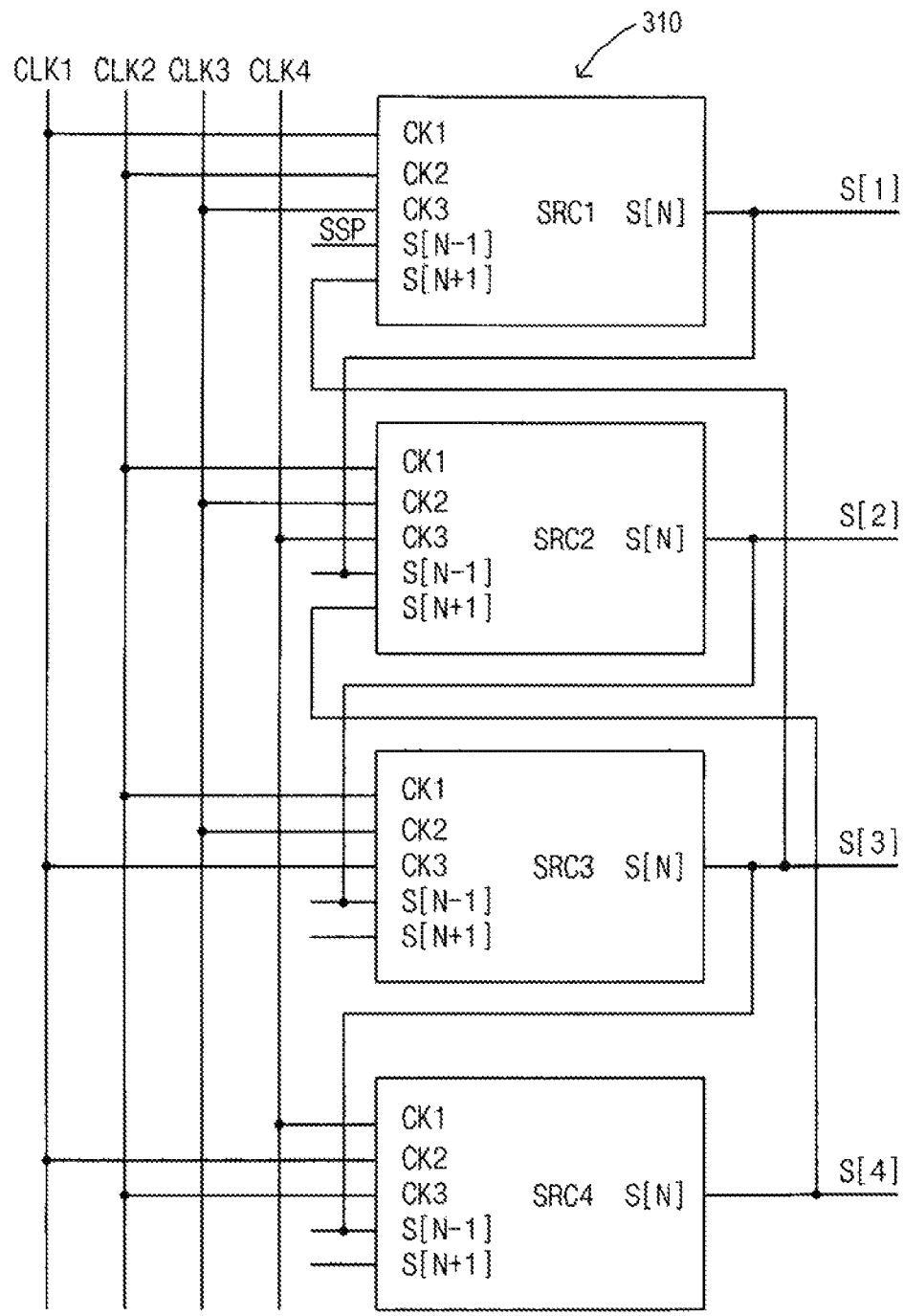
FIG. 10 is a block diagram illustrating a first gate driver according to an exemplary embodiment.
Figure 11:
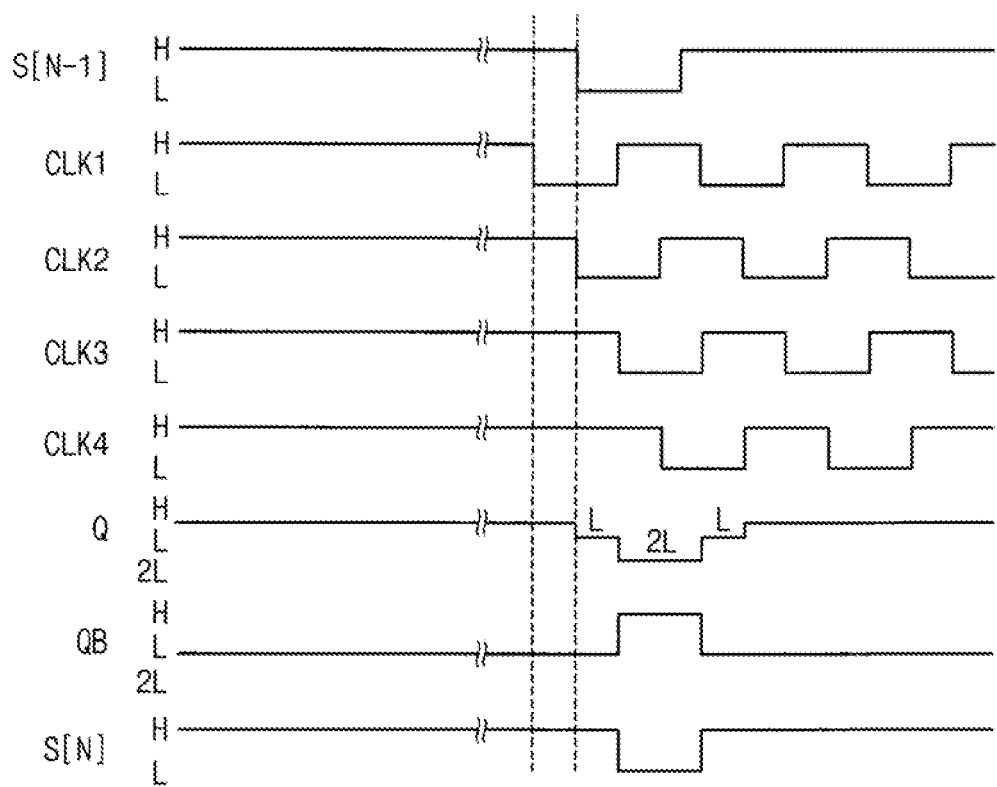
FIG. 11 is a timing diagram for explaining an operation of the first gate driver of FIG. 10.

FIG. 10 is a block diagram illustrating a first gate driver according to an exemplary embodiment. FIG. 11 is a timing diagram for explaining an operation of the first gate driver of FIG. 10.

The gate driver, the method of driving the display panel, and the display apparatus of the present exemplary embodiment are substantially the same as the gate driver, the method of driving the display panel, and the display apparatus explained with reference to FIGS. 5 and 6 except that the gate driver is operated only in the sequential driving mode. Thus, the same reference numerals will be used to refer to the same or like parts as those described in the exemplary embodiments of FIGS. 5 and 6, and any repetitive explanation concerning the above elements will be omitted.

Referring to FIGS. 1, 3, 10 and 11, the display apparatus 1000 includes a display panel 100 and a driver 200 for driving the display panel 100.

The display panel 100 displays an image. The display panel 100 includes a plurality of gate lines GL1 to GLn, a plurality of data lines DL1 to DLm and a plurality of subpixels P connected to gate lines GL1 to GLn and to data lines DL1 to DLm.

The driver 200 includes a controller 210, a voltage generator 220, a first gate driver 310, a second gate driver 320 and a data driver 240.

The first gate driver 310 includes a plurality of stages SRC1, SRC2, SRC3, SRC4, . . . connected to one another.

Each of the stages SRC1, SRC2, SRC3, SRC4, . . . includes a first clock terminal CK1, a second clock terminal CK2, a third clock terminal CK3, a first input terminal S[N−1], a second input terminal S[N+1] and an output terminal S[N]. Each of the stages SRC1, SRC2, SRC3, SRC4, . . . may further include a concurrent driving signal input terminal GCK, and a high DC voltage input terminal VGH.

In the present exemplary embodiment, four clock signals CLK1 to CLK4 are applied to the stages of the gate driver 310. Three clock signals among the four clock signals CLK1 to CLK4 are applied to one stage of the gate driver 310.

The first clock signal CLK1, the second clock signal CLK2, the third clock signal CLK3 and the fourth clock signal CLK4 have different timings. For example, the third clock signal CLK3 may be a signal inverted from the first clock signal CLK1. For example, the fourth clock signal CLK4 may be a signal inverted from the second clock signal CLK2.

An N-th stage includes a first input part 311, a second input part 312, a pull up part 313, a pull down part 314, a holding part 315 and a stabilizing part 316.

The first input part 311 transmits the first clock signal CLK1 applied to the first clock terminal CK1 to a second node QB in response to a signal at a first node Q.

The second input part 312 transmits an input signal S[N−1] to the first node Q in response to the second clock signal CLK2 applied to the second clock terminal CK2.

The pull up part 313 pulls up the gate output signal S[N] in response to a signal at the second node QB.

The pull down part 314 pulls down the gate output signal S[N] in response to the signal at the first node Q.

The holding part 315 maintains the signal at the second node QB in response to the first clock signal CLK1.

The stabilizing part 316 stabilizes the gate output signal S[N] in response to the signal at the second node QB and the third clock signal CLK3. The stabilizing part 316 includes a first switching element T6 and a second switching element T7 connected in series to each other. The first switching element T6 includes a gate electrode connected to the second node QB, a source electrode to which a pull up voltage VGH is applied, and a drain electrode connected to a source electrode of the second switching element T7. The second switching element T7 includes a gate electrode connected to the third clock terminal CK3 to which the third clock signal CLK3 is applied, the source electrode connected to the drain electrode of the first switching element T6, and a drain electrode connected to the first node Q.

According to the present exemplary embodiment, the first and second switching elements T6 and T7, respectively, of the stabilizing part 316 are not directly connected to the gate output terminal OUT. Thus, the first and second switching elements T6 and T7, respectively, of the stabilizing part 316 may be protected from damage due to static electricity transmitted through the gate output terminal OUT to the gate lines GL of the display panel 100 in a manufacturing process of the display panel 100 and in a static electricity test process.

When the input signal S[N−1] and the second clock signal CLK2 respectively have the low level L, the signal at the first node Q has the low level L by the second input part 312, and the signal at the second node QB has the low level L.

When the third clock signal CLK3 changes to the low level L, the signal at the first node Q decreases to a second low level 2L and the gate output signal S[N] having the low level L is outputted to the gate output terminal OUT.

When the first clock signal CLK1 turns back to the low level L, the gate output signal S[N] has the high level H, and the gate output signal S[N] maintains the high level H.

According to the present exemplary embodiment, the first and second switching elements T6 and T7, respectively, of the stabilizing part 316 of the gate driver 310 are not directly connected to the gate output terminal OUT so that the gate driver 310 may be protected from damage due to static electricity.

Figure 12:
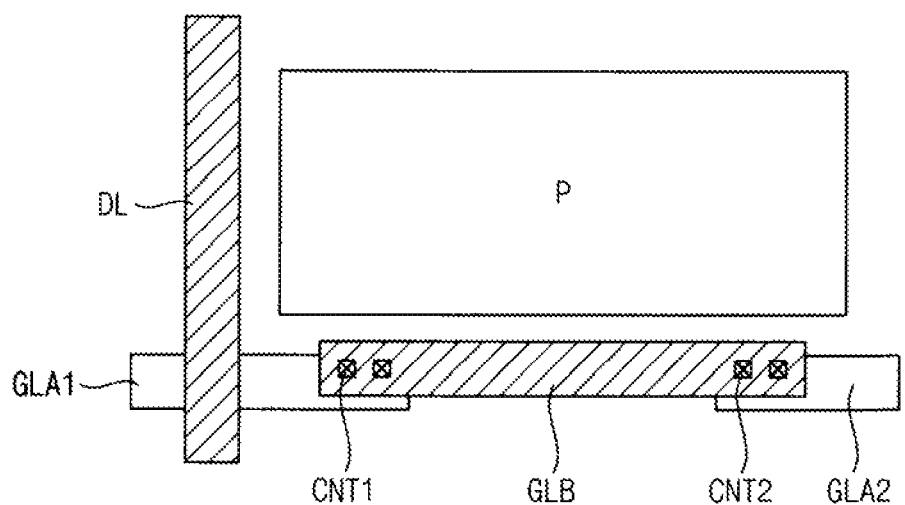
FIG. 12 is a plan view illustrating a gate line according to an exemplary embodiment.

FIG. 12 is a plan view illustrating a gate line according to an exemplary embodiment.

The gate driver, the method of driving the display panel and the display apparatus of the present exemplary embodiment are substantially the same as the gate driver, the method of driving the display panel and the display apparatus explained with reference to FIGS. 1 to 4 except that the gate line has parts which are formed on a gate metal layer and a data metal layer, and which overlap with each other. Thus, the same reference numerals will be used to refer to the same or like parts as those described in the exemplary embodiments of FIGS. 1 to 4 and any repetitive explanation concerning the above elements will be omitted.

Referring to FIGS. 1 and 12, the display apparatus 1000 includes a display panel 100 and a driver 200 for driving the display panel 100.

The display panel 100 displays an image. The display panel 100 includes a plurality of gate lines GL1 to GLn, a plurality of data lines DL1 to DLm and a plurality of subpixels P connected to gate lines GL1 to GLn and to the data lines DL1 to DLm.

In the present exemplary embodiment, the gate line GL includes a first gate line part GLA1 and GLA2 and a second gate line part GLB.

The first gate line part GLA1 and GLA2 is disposed on a gate metal layer. The second gate line part GLB is disposed on a data metal layer different from the gate metal layer. The second gate line part GLB may be disposed on a layer the same as the data line DL.

In the present exemplary embodiment, the gate line GL includes a plurality of the first gate line parts GLA1 and GLA2. The first gate line parts GLA1 and GLA2 are disposed along an extending direction of the gate line GL. The first gate line parts GLA1 and GLA2 are not directly connected to each other. Each of the first gate line parts GLA1 and GLA2 has an island pattern.

The second gate line part GLB is partially overlapped with the first gate line part GLA1 and GLA2. The second gate line part GLB may be connected to the first gate line part GLA1 and GLA2 at the overlapped region through a contact hole CNT1 and CNT2.

For convenience of explanation, the second gate line part GLB is slightly moved from the first gate line part GLA1 and GLA2 in a direction of the data line DL in FIG. 12. However, the second gate line part GLB may be precisely overlapped with first gate line part GLA1 and GLA2 in a vertical direction unlike in FIG. 12.

According to the present exemplary embodiment, the parts of the gate line GL are disposed in plural layers so that the quantity of the static electricity transmitted to the gate driver 310 through the gate lines GL may be decreased in a manufacturing process of the display panel 100 and in a static electricity test process.

Figure 13:
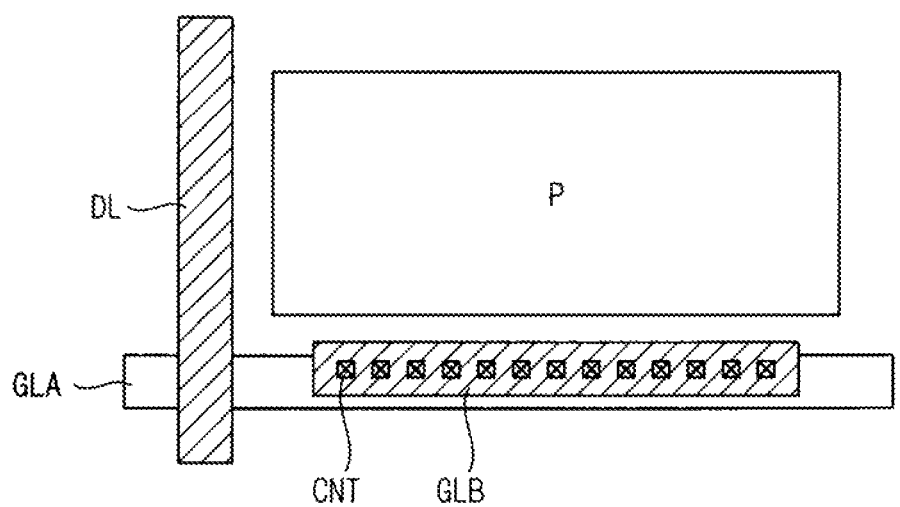
FIG. 13 is a plan view illustrating a gate line according to an exemplary embodiment.

FIG. 13 is a plan view illustrating a gate line according to an exemplary embodiment.

The gate driver, the method of driving the display panel, and the display apparatus of the present exemplary embodiment are substantially the same as the gate driver, the method of driving the display panel and the display apparatus explained with reference to FIGS. 1 to 4 except that the gate line has parts which are formed on a gate metal layer and a data metal layer and which overlap with each other. Thus, the same reference numerals will be used to refer to the same or like parts as those described in the exemplary embodiments of FIGS. 1 to 4, and any repetitive explanation concerning the above elements will be omitted.

Referring to FIGS. 1 and 13, the display apparatus 1000 includes a display panel 100 and a driver 200 for driving the display panel 100.

The display panel 100 displays an image. The display panel 100 includes a plurality of gate lines GL1 to GLn, a plurality of data lines DL1 to DLm, and a plurality of subpixels P connected to gate lines GL1 to GLn and to the data lines DL1 to DLm.

In the present exemplary embodiment, the gate line GL includes a first gate line part GLA and a second gate line part GLB.

The first gate line part GLA is disposed on a gate metal layer. The second gate line part GLB is disposed on a data metal layer different from the gate metal layer. The second gate line part GLB may be disposed on a layer the same as the data line DL.

In the present exemplary embodiment, the first gate line part GLA extends along an extending direction of the gate line GL. Thus, the first gate line part GLA and the second gate line part GLB forms a dual line pattern.

The second gate line part GLB is totally overlapped with the first gate line part GLA. The second gate line part GLB may be connected to the first gate line part GLA at the overlapped region through a plurality of contact holes CNT.

For convenience of explanation, the second gate line part GLB is slightly moved from the first gate line part GLA in a direction of data line DL in FIG. 13. However, the second gate line part GLB may be precisely overlapped with first gate line part GLA in a vertical direction, unlike in FIG. 13.

According to the present exemplary embodiment, the parts of the gate line GL are disposed in plural layers so that the quantity of the static electricity transmitted to the gate driver 310 through the gate lines GL may be decreased in a manufacturing process of the display panel 100 and in a static electricity test process.

As explained above, according to the present exemplary embodiments, the number of switching elements directly connected to a gate output terminal is minimized or the gate line includes the first gate line part and the second gate line part formed on the plural layers so that the gate driver may be protected from damage due to static electricity.

Although the gate driver, the method of driving the display panel, and the display apparatus including the gate driver according to the exemplary embodiments are explained with reference to figures, it is to be understood that the foregoing is illustrative of various exemplary embodiments, and is not to be construed as limited to the specific exemplary embodiments disclosed.

The present invention may be applied to a display apparatus having a gate driver driving a plurality of gate lines of the display apparatus, and to a display system including the display apparatus. For example, the present invention may be applied to an organic light emitting display apparatus and a liquid crystal display apparatus, or it may be applied to a television, a computer monitor, a laptop, a digital camera, a cellular phone, a smart phone, a personal digital assistant (PDA), a portable multimedia player (PMP), a MP3 player, a navigation system, a video phone, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. Therefore, it is to be understood that the foregoing is illustrative of various exemplary embodiments, and is not to be construed as limited to the specific exemplary embodiments disclosed, and that modifications to the disclosed exemplary embodiments, as well as other exemplary embodiments, are intended to be included within the scope of the appended claims.

What is claimed is:

1. A gate driver comprising a plurality of stages respectively outputting a plurality of gate output signals, an N-th stage comprising:
    a first input part for transmitting a first clock signal to a second node in response to a signal at a first node;
    a second input part for transmitting an input signal to the first node in response to a second clock signal;
    a pull up part for pulling up the gate output signal in response to a signal at the second node;
    a pull down part for pulling down the gate output signal in response to the signal at the first node;
    a holding part for maintaining the signal at the second node in response to the first clock signal; and
    a stabilizing part for stabilizing the gate output signal in response to the signal at the second node and a third clock signal;
    wherein N is a positive integer;
    wherein the first input part comprises a first input switching element;
    wherein the pull down part comprises a pull down switching element;
    wherein a gate electrode of the first input switching element is connected to a gate electrode of the pull down switching element;
    wherein the pull up part comprises a pull up switching element;
    wherein the stabilizing part comprises a first switching element and a second switching element connected in series to each other; and
        wherein a gate electrode of the pull up switching element is connected to a gate electrode of the first switching element of the stabilizing part.

2. The gate driver of claim 1, wherein the gate electrode of the first switching element is connected to the second node, and wherein the first switching element further comprises a source electrode to which a pull up voltage is applied, and a drain electrode connected to a source electrode of the second switching element; and
    wherein the second switching element comprises a gate electrode to which the third clock signal is applied, the source electrode connected to the drain electrode of the first switching element, and a drain electrode connected to the first node.

3. The gate driver of claim 1, wherein the gate electrode of the first input switching element is connected to the first node, the first input switching element further comprising:
   a source electrode to which the first clock signal is applied; and
   a drain electrode connected to the second node.

4. The gate driver of claim 1, wherein the second input part comprises a second input switching element, the second input switching element comprising:
   a gate electrode to which the second clock signal is applied;
   a source electrode to which the input signal is applied; and
   a drain electrode connected to the first node.

5. The gate driver of claim 1, wherein the gate electrode of the pull up switching element is connected to the second node, the pull up switching element further comprising:
   a source electrode to which a pull up voltage is applied; and
   a drain electrode connected to an output terminal for outputting the gate output signal.

6. The gate driver of claim 1, wherein the gate electrode of the pull down switching element is connected to the first node, the pull down switching element further comprising:
   a source electrode connected to an output terminal for outputting the gate output signal; and
   a drain electrode to which the third clock signal is applied.

7. The gate driver of claim 1, wherein the holding part comprises a holding switching element, the holding switching element comprising:
   a gate electrode and a source electrode to which the first clock signal is applied; and
   a drain electrode connected to the second node.

8. The gate driver of claim 1, wherein the N-th stage further comprises a concurrent driving controller for deactivating the pull down part in response to a concurrent driving signal.

9. The gate driver of claim 8, wherein the concurrent driving controller comprises a concurrent driving switching element, the concurrent driving switching element comprising:
   a gate electrode to which the concurrent driving signal is applied;
   a source electrode to which a high DC voltage is applied; and
   a drain electrode connected to the first node.

10. The gate driver of claim 9, wherein a pull up voltage applied to the pull up part is substantially the same as the concurrent driving signal.

11. The gate driver of claim 1, wherein the second clock signal has a wave form substantially the same as a wave form of the first clock signal, and
   wherein the third clock signal has a timing different from a timing of the first clock signal.

12. The gate driver of claim 1, wherein the first clock signal, the second clock signal and the third clock signal have different timings; and
   wherein a rising edge of the second clock signal is disposed between a rising edge of the first clock signal and a rising edge of the third clock signal.

13. A method of driving a display panel, the method comprising the steps of:
   transmitting a first clock signal to a second node in response to a signal at a first node;
   transmitting an input signal to the first node in response to a second clock signal;
   pulling up a gate output signal in response to a signal at the second node;
   pulling down the gate output signal in response to the signal at the first node;
   maintaining the signal at the second node in response to the first clock signal; and
   stabilizing the gate output signal in response to the signal at the second node and a third clock signal;
   wherein, when the signal at the first node has an active level, the first clock signal is transmitted to the second node and the gate output signal is pulled down; and
   wherein, when the signal at the second node has an active level, the gate output signal is pulled up and the gate output signal is stabilized.

14. The method of claim 13, wherein the gate output signal is stabilized using a first switching element and a second switching element connected in series to each other.

15. The method of claim 14, wherein the first switching element comprises a gate electrode connected to the second node, a source electrode to which a pull up voltage is applied, and a drain electrode connected to a source electrode of the second switching element; and
   wherein the second switching element comprises a gate electrode to which the third clock signal is applied, the source electrode connected to the drain electrode of the first switching element and a drain electrode connected to the first node.

16. A display apparatus, comprising:
   a display panel including a plurality of gate lines, a plurality of data lines crossing the gate lines, and a plurality of pixels;
   a data driver for outputting respective data signals to respective ones of the data lines; and
   a gate driver including a plurality of stages for outputting respective gate output signals to respective ones of the gate lines,
   wherein an N-th stage of the gate driver comprises:
   a first input part for transmitting a first clock signal to a second node in response to a signal at a first node;
   a second input part for transmitting an input signal to the first node in response to a second clock signal;
   a pull up part for pulling up the gate output signal in response to a signal at the second node;
   a pull down part for pulling down the gate output signal in response to the signal at the first node;
   a holding part for maintaining the signal at the second node in response to the first clock signal; and
   a stabilizing part for stabilizing the gate output signal in response to the signal at the second node and a third clock signal;
   wherein N is a positive integer;
   wherein the first input part comprises a first input switching element,
   wherein the pull down part comprises a pull down switching element,
   wherein a gate electrode of the first input switching element is connected to a gate electrode of the pull down switching element,
   wherein the pull up part comprises a pull up switching element,
   wherein the stabilizing part comprises a first switching element and a second switching element connected in series to each other, and
   wherein a gate electrode of the pull up switching element is connected to a gate electrode of the first switching element of the stabilizing part.

17. The display apparatus of claim 16, wherein the first input switching element comprises a gate electrode connected to the second node, a source electrode to which a pull up voltage is applied, and a drain electrode connected to a source electrode of the second switching element, and wherein the second switching element comprises a gate electrode to which the third clock signal is applied, a source electrode connected to the drain electrode of the first switching element and a drain electrode connected to the first node.

18. The display apparatus of claim 16, wherein the gate line comprises:

a first gate line part disposed on a gate metal layer; and a second gate line part disposed on a layer different from the gate metal layer, and overlapped with the first gate line part.

19. The display apparatus of claim 18, wherein the second gate line part is disposed on a layer the same as the data line.

20. The display apparatus of claim 18, wherein the gate line includes a plurality of the first gate line parts disposed along an extending direction of the gate line, and wherein the first gate line parts are not directly connected to each other.

21. The display apparatus of claim 18, wherein the first gate line part extends along an extending direction of the gate line.

\* \* \* \* \*